(12) United States Patent
Chen

(10) Patent No.: US 6,490,156 B2
(45) Date of Patent: Dec. 3, 2002

(54) INDUSTRIAL COMPUTER CASE STRUCTURE WITH MODULAR INTERFACE CARD EXPANSION CAPABILITY

(75) Inventor: Chih-chung Chen, Taipei (TW)

(73) Assignee: Portwell Inc., Taipei (TW)

( * ) Notice: Subject to any disclaimer, the term of this patent is extended or adjusted under 35 U.S.C. 154(b) by 0 days.

(21) Appl. No.: 09/962,355

(22) Filed: Sep. 26, 2001

(65) Prior Publication Data

US 2002/0044420 A1 Apr. 18, 2002

(51) Int. Cl.[7] .................................................. H05K 1/14
(52) U.S. Cl. ........................ 361/686; 361/803; 439/928
(58) Field of Search .......................... 361/686, 683–685, 361/601, 788, 803, 724–727; 439/928

(56) References Cited

U.S. PATENT DOCUMENTS 5,187,643 A  *  2/1993  I-Shou ........................ 361/686
5,808,876 A  *  9/1998  Mullenbach et al. ........ 361/788
6,304,537 B1 * 10/2001  Seo et al. ................. 369/53.45

* cited by examiner

Primary Examiner—Darren Schuberg
Assistant Examiner—Hung Van Duong
(74) Attorney, Agent, or Firm—Troxell Law Office PLLC

(57) ABSTRACT

An industrial computer case structure with modular interface card expansion capability comprised of a main case and an expansion case that are both less than 2U (1U=4.445 cm) in height. The connector section of a mainboard installed inside the main case projects through an end wall of the main case. The slot connector of a unitary two-to-one expansion frame projects from one end wall of the expansion case, enabling the connection of the slot connector to the connector section of the mainboard and the connection of the two slot connectors at the other end of the expansion frame to additional interface cards. This results in the establishment of electrical continuity between the mainboard and the interface cards, while also effectively reducing overall computer case height and space occupancy.

4 Claims, 6 Drawing Sheets

INDUSTRIAL COMPUTER CASE STRUCTURE WITH MODULAR INTERFACE CARD EXPANSION CAPABILITY

BACKGROUND OF THE INVENTION

1 Field of the Invention

The invention herein relates to an industrial computer case structure with modular interface card expansion capability in which the structural design of the two-section computer case is limited to a height of less than 2U (1U= 4.445 cm) and supports the establishment of electrical continuity between the mainboard inside a main case and the interface cards contained in an expansion case, which not only permits configuration as per application requirements, but also achieves the objectives of flexible interface card expansion and the effective reduction of the total height and space occupancy of the computer case.

2 Description of the Prior Art

Referring to FIG. 1, a conventional industrial computer case 100, the said case 100 typically has a minimum of one internally installed hard disk drive 200 and a back plane 300; disposed on the said back plane 300 are a plurality of slots 301 that provide for the vertical insertion and connection of interface cards 500 to a minimum of one mainboard 400 and, furthermore, the brackets 401 and 501 of the said case 100 have different capability input/output connection ports mounted in them that provides for respective input/output connectivity (such as to an a PS/2 port, a parallel port, a serial port, and a USB port, etc.); since industrial computers are often utilized for specific applications, it is necessary to first define the intended capability (such as a firewall system or a mail server, a printer server, and a proxy server, etc.), with the resulting machine ordinarily tall to accommodate the installation of the requisite hard disk drive 200 and mainboard 400 inside the said case 100; however, utilizing such an original specification case 100 occupies a space that is considerably larger than expected and, furthermore, is of higher production cost.

In view of the said shortcomings of conventional industrial computers, the inventor of the invention herein addressed the existent structure by improving the deficiencies based on rational solutions which, following extensive research and design, culminated in the successful completion of the improved structure industrial computer of the invention herein.

SUMMARY OF THE INVENTION

The primary objective of the invention herein is to provide an industrial computer case structure with modular interface card expansion capability, the main case of which limited to a height of less than 2U and connected to an expansion case that is also limited to a height of less than 2U such that when a minimum of one application is defined, the total space occupancy is reduced below that of a conventional industrial computer, wherein the connector section of a mainboard installed inside the main case projects through an end wall of the main case and the slot connector of a unitary two-to-one expansion frame projects from one end wall of the expansion case, enabling the connection of the said slot connector to the connector section of a mainboard and the connection of interface cards inserted in the two slot connectors at the other end of the expansion fame and linked in parallel to the mainboard to thereby achieve the objectives of establishing electrical continuity between the mainboard and the interface cards as well as flexible expansion capability.

Another objective of the invention herein is to provide an industrial computer case structure with modular interface card expansion capability, wherein the conjoining of the expansion case to the main case is located by a tab and a slot disposed at four positions and following conjoinment, the said tab is fastened to the main case or the expansion case by screws.

Yet another objective of the invention herein is to provide an industrial computer case structure with modular interface card expansion capability, wherein a recessed opening is formed in the end wall of the main case, with the said recessed opening capable of accommodating the insertion through of the connector section of the mainboard and, furthermore, an upright tab extends from the said expansion case at four positions along the end wall of the expansion frame that are utilized to reduce impact to the slot connector by external objects.

To enable a further understanding by the examination committee of the arrangement, structure, and functions of the invention herein, the brief description of the drawings below are followed by the detailed description of the most preferred embodiment of the present invention.

DETAILED DESCRIPTION OF THE INVENTION

Figure 1:
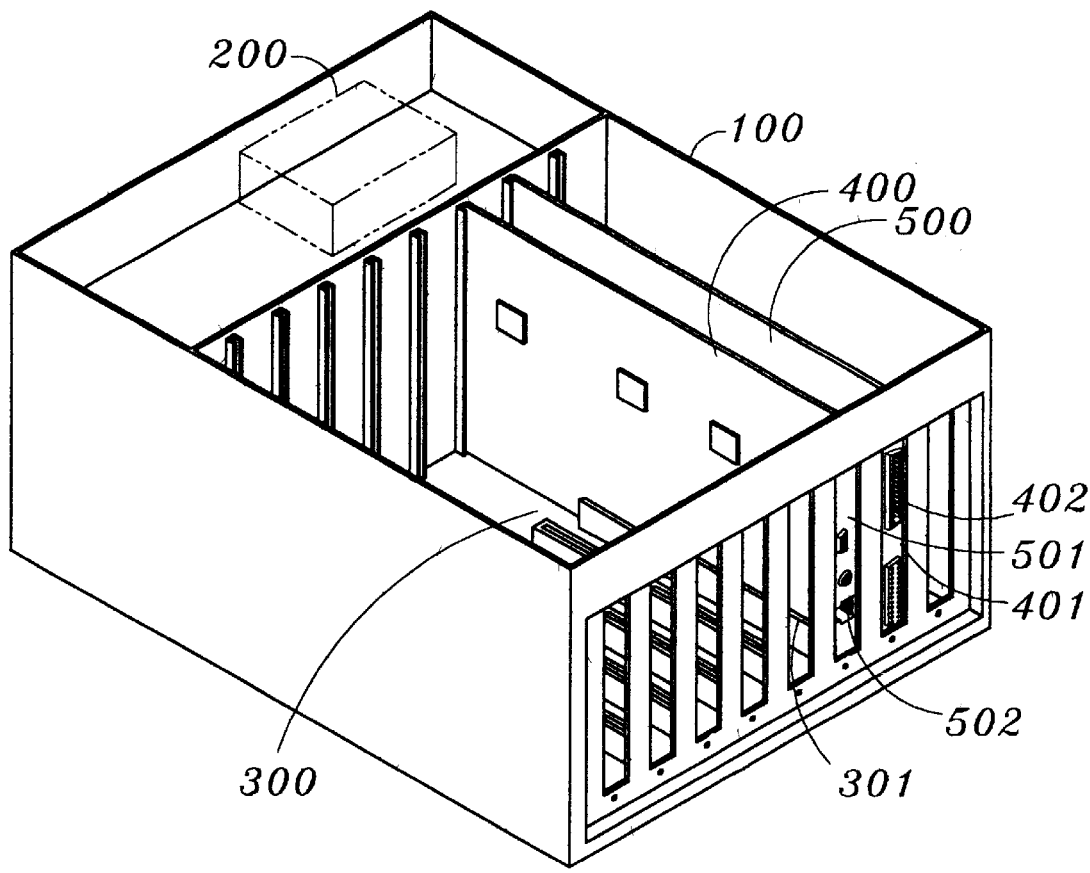
FIG. 1 is an isometric drawing of a conventional industrial computer.
Figure 2:
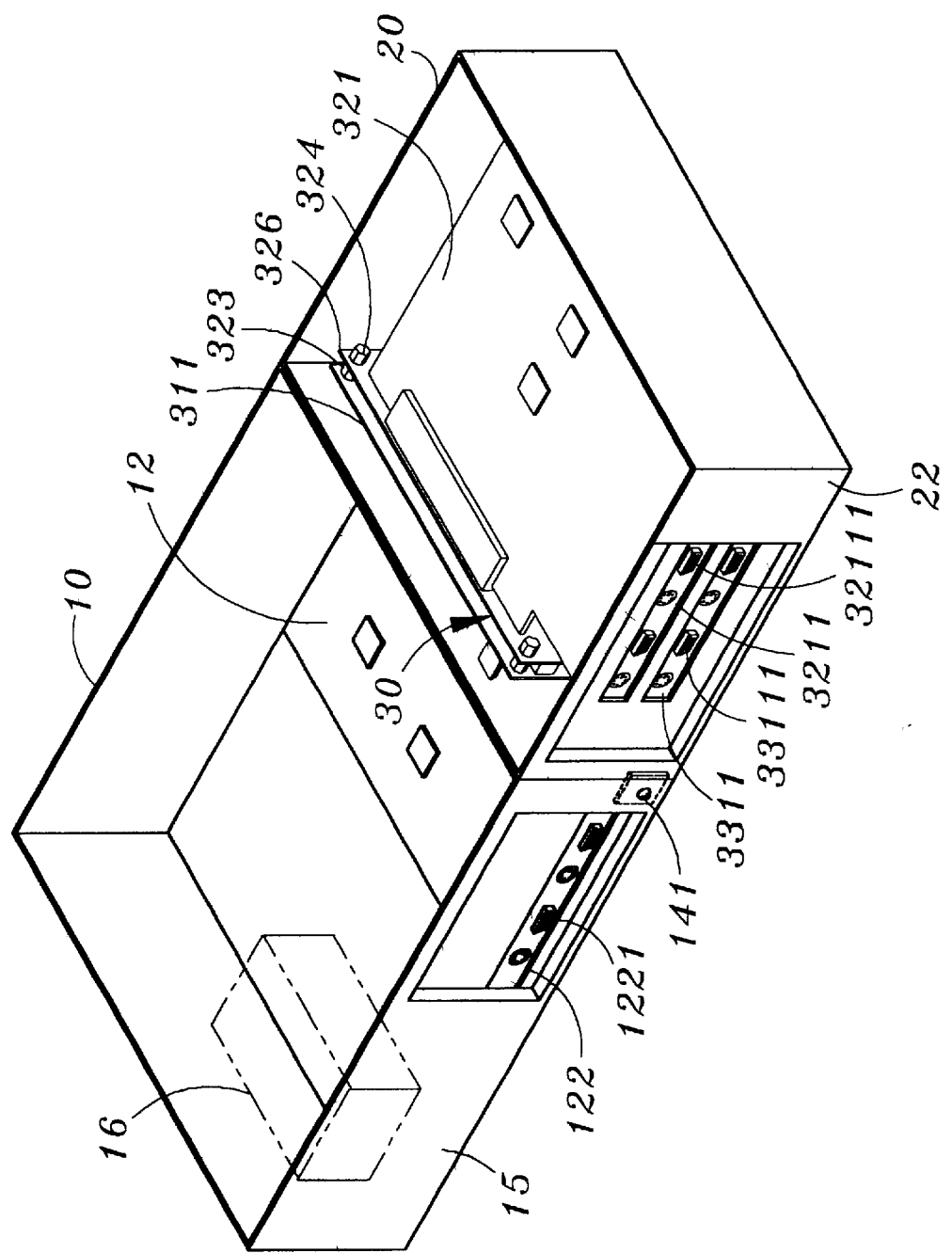
FIG. 2 is an isometric drawing of the invention herein following assembly.
Figure 3:
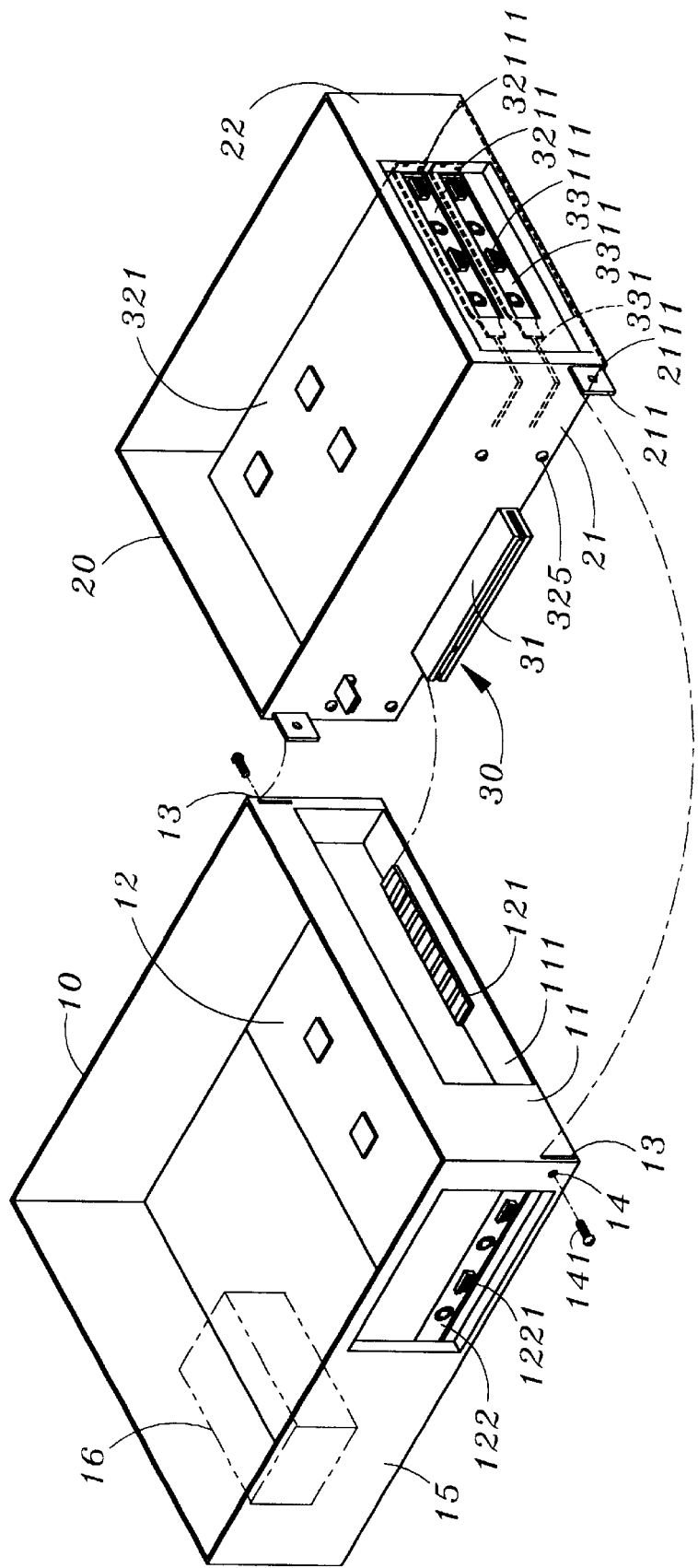
FIG. 3 is an isometric drawing of the invention herein before assembly.
Figure 4:
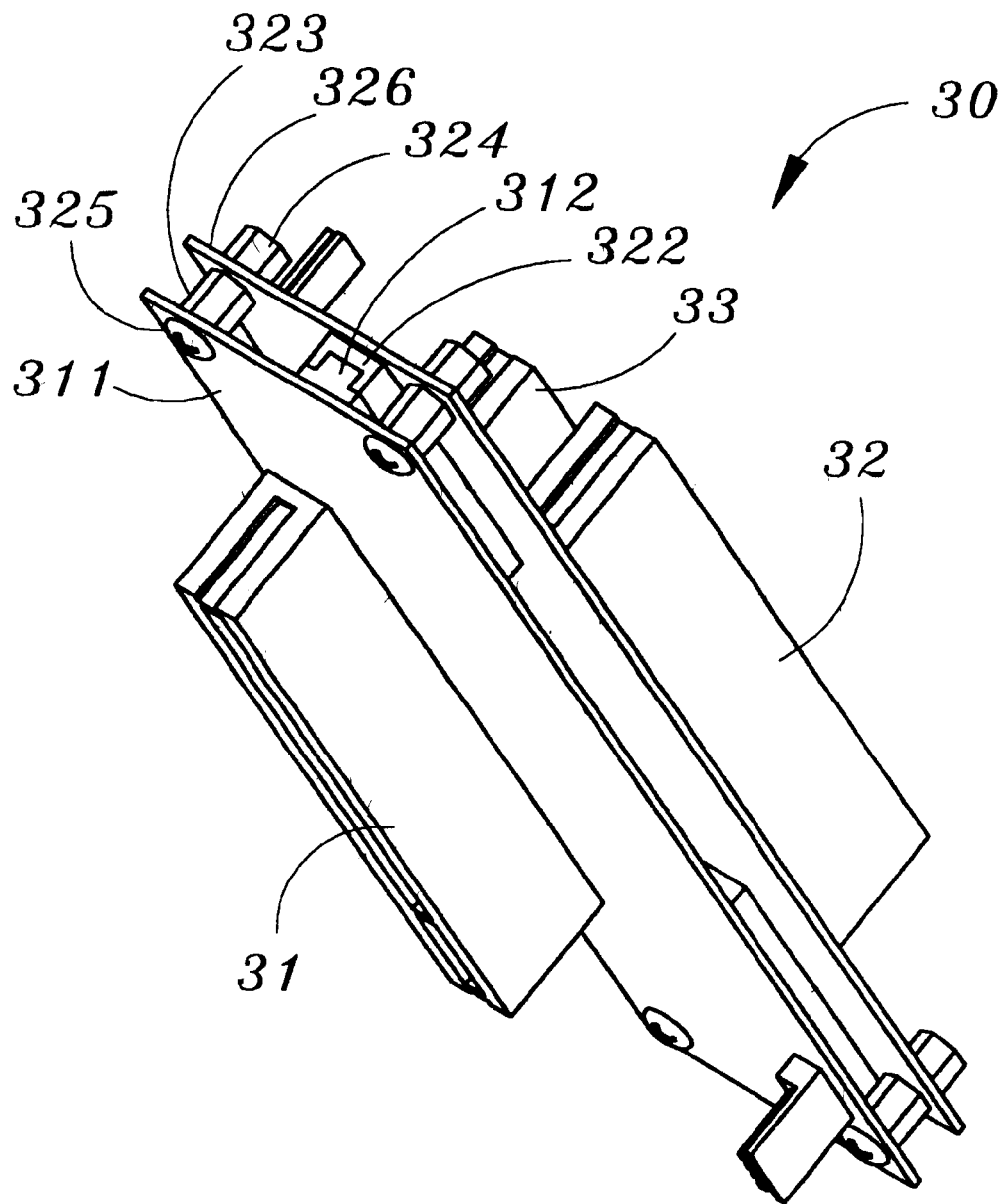
FIG. 4 is an isometric drawing of the expansion frame of the invention herein.

Referring to FIG. 2, FIG. 3, and FIG. 4, the industrial computer case structure with modular interface card expansion capability of the invention herein is comprised of a main case 10 and an expansion case 20 that are both less than 2U (1U=4.445 cm) in height, wherein a recessed opening 111 is formed in an end wall 11 of the main case 10, the said recessed opening 111 capable of accommodating the insertion through of the connector section 121 of a mainboard 12 and also reducing impact to the connector section 121 by external objects; a minimum of one slot 13 is formed along either side of the of the said end wall 11 and, furthermore, a hole 14 is formed in the said main case 10 proximal and, furthermore, perpendicular to the said slot 13 that provides for the insertion of a screw 141; a bracket 122 fastened to the mainboard 12 is positioned at any lateral wall 15 in which the recessed opening 111 has not been formed, the said bracket 122 having a plurality of different capability input/ output connection ports 1221 (such as a PS/2 port, a parallel port, a serial port, and a USB port, etc.) mounted in it that provides for the linking of the respective input/output connectors and, furthermore, a minimum of one hard disk drive 16 is installed within the said main case 10 for data storage.

The expansion case 20 has projecting from one end wall 21 a slot connector 31 of a unitary two-to-one expansion frame 30 (while the embodiment herein has a unitary two-to-one expansion frame 30 due to the height limitations of the main case 10, a unitary one-to-one expansion frame may be substituted) that enables union between the said slot connector 31 and the mainboard 12 connector section 121 and, furthermore, there are two slot connectors 32 and 33 at the opposite end of the said expansion frame 30 capable of accommodating the respective connection of additional interface cards 321 and 331 (such as audio cards, sound cards, display cards, and network cards, etc.) such that electrical continuity is established between the mainboard 12 and the said interface cards 321 and 331; positioned in the other end wall 22 of the said expansion case 20 and fastened to the said interface cards 321 and 331 are brackets 3211 and 3311, the said brackets 3211 and 3311 having different capability input/output connection ports 32111 and 33111 (such as PS/2 port, a parallel port, a serial port, and a USB port, etc.) mounted in them and, furthermore, an upright tab 211 extends from the said expansion case 20 at either side of the expansion frame 30 end wall 21; the tab 211 is aligned with the slot 13 of the main case 10 and utilized to reduce impact to the slot connector 31 by external objects, with the said tab 211 fastened in the main case 10 slot 13; additionally, a mounting hole 2111 is formed in the said tab 211 such that during assembly, the tab 211 is inserted into the slot 13 and then a screw 141 is inserted through the hole 14 and fastened into the mounting hole 2111 to precisely and, furthermore, firmly conjoin the connection section 121 to the slot connector 31.

Figure 5:
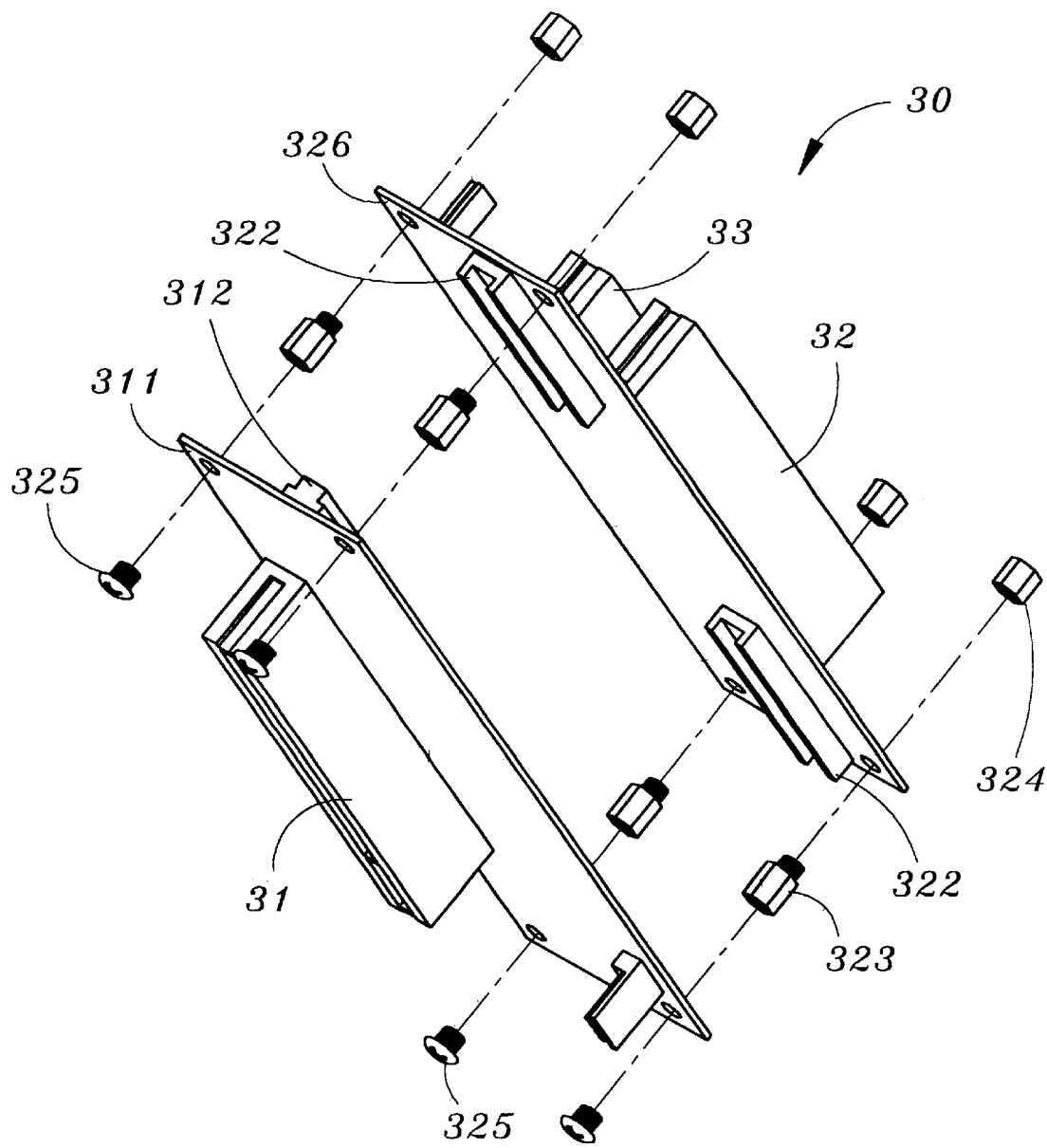
FIG. 5 is an exploded drawing of the expansion frame of the invention herein.
Figure 6:
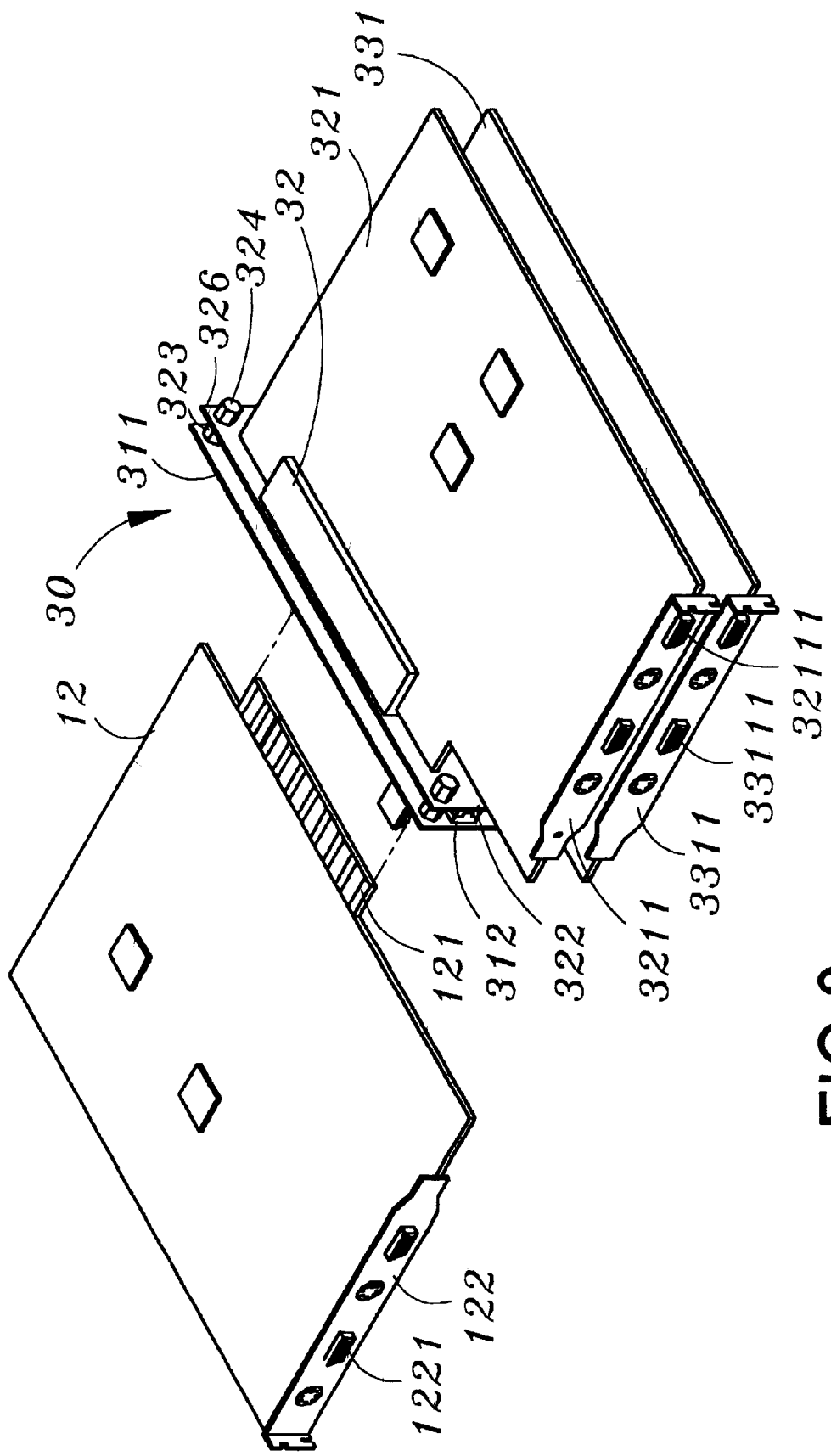
FIG. 6 is an isometric drawing of expansion frame of the invention herein connected to the mainboard.

Referring to FIG. 4, FIG. 5, and FIG. 6, the drawings illustrating the circuiting panels 311 and 326 respectively disposed at the sides opposite to that of the slot connector 31 as well as the slot connectors 32 and 33 of the said expansion frame 30, each of the said circuiting panels 311 and 326 has respectively extending along their facing sides two matching pairs of footing 312 and channel 322 fixtures that are coupled by linear insertion to achieve electrical continuity between the slot connector 31 ensconcing the mainboard 12 and the slot connectors 32 and 33 ensconcing the interface cards 321 and 331; threaded posts 323, nuts 324, and screws 325 are then utilized to mount the two circuiting panels 311 and 326 onto the end wall 21 of the expansion case 20 (as shown in FIG. 3).

Given the said structural arrangement, the interface cards 321 and 331 are installed in the expansion frame 30 of the expansion case 20 as needed to fulfill specific application requirements and it is only necessary to determine the particular capability sought (such as a firewall system or a mail server, a printer server, and a proxy server, etc.) and, as such, the present invention achieves an effective reduction in the total height and space occupancy of the computer case.

The preceding description only discloses the most preferred embodiment of the invention herein and although persons skilled in the related technology are capable of various modifications thereunto, all such modifications shall remain within the spirit and claims of the invention herein.

In summation of the foregoing section, the structural arrangement of the invention herein is unprecedented in terms of product form as well as original and capable of additional functionality and, furthermore, is practical and reflects the ideals of innovation and invention.

What is claimed is:

1. A computer case structure with a modular interface card expansion capability comprising:
    a) a main case having a bottom, a first end wall and at least one first side wall joined with the first end wall, the first end wall having a recess therein;
    b) a mainboard mounted in the main case, the mainboard aligned with the bottom such that a height of the main case is less than 2U (U=4.445 cm), the mainboard having a connector section extending into the recess so as to be accessible from exteriorly of the main case and a mainboard bracket with a plurality of input/output ports positioned on the at least one first side wall such that the plurality of input/output ports are accessible from exteriorly of the main case;
    c) an expansion case having a second end wall and at least one second side wall joined with the second end wall, the expansion case removably attached to the main case by tabs extending from one of the main case and expansion case engaging slots in the other of the main case and expansion case such that the first and second end walls are adjacent to each other;
    d) an expansion frame attached to the second end wall and including a first slot connector extending outwardly from the second end wall in engagement with the connection section of the mainboard, and at least two second slot connectors connected to the first slot connector and located in the expansion case; and,
    e) a plurality of interface cards located in the expansion case in engagement with the second slot connectors, each interface card having an interface card bracket with a plurality of input/output connection ports positioned on the at least one second side wall such that the plurality of input/output ports are accessible from exteriorly of the expansion case.

2. The computer case structure of claim 1 wherein the expansion frame comprises:
    a) a first circuiting panel having the first slot connector thereon;
    b) a second circuiting panel having the plurality of second slot connectors thereon;
    c) at least one footing fixture on the first circuit panel; and,
    d) at least one channel fixture on the second circuiting panel removably engaging the at least one footing fixture.

3. The computer case of claim 1 further comprising a hard disk drive positioned in the main case.

4. The computer case of claim 1 wherein the slots are formed in the first end wall and the tabs extend from the second end wall.

* * * * *